United States Patent
Kurokawa

(10) Patent No.: US 7,295,063 B2
(45) Date of Patent: Nov. 13, 2007

(54) CLASS D AMPLIFIER

(75) Inventor: Tatsufumi Kurokawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 118 days.

(21) Appl. No.: 11/094,229

(22) Filed: Mar. 31, 2005

(65) Prior Publication Data
US 2005/0248399 A1 Nov. 10, 2005

(30) Foreign Application Priority Data
May 6, 2004 (JP) ............................. 2004-137103

(51) Int. Cl.
*H03F 3/38* (2006.01)
*H03F 3/217* (2006.01)
(52) U.S. Cl. ..................... 330/10; 330/251; 330/207 A
(58) Field of Classification Search .................... None
See application file for complete search history.

(56) References Cited
U.S. PATENT DOCUMENTS
4,673,889 A * 6/1987 Cini et al. ..................... 330/10
4,949,048 A * 8/1990 Tokumo et al. ................ 330/10
5,115,205 A 5/1992 Holmes, Jr.
6,448,851 B1 * 9/2002 McIntosh et al. ........ 330/207 A
2003/0030486 A1 2/2003 Noro et al.

FOREIGN PATENT DOCUMENTS
GB 1 239 922 A 7/1971
JP 2003-115730 A 4/2003

* cited by examiner

*Primary Examiner*—Robert Pascal
*Assistant Examiner*—Alan Wong
(74) *Attorney, Agent, or Firm*—Sughrue Mion Pllc.

(57) ABSTRACT

The class D amplifier comprises a differential signal output unit for outputting differential signals from voice signals which are input from the input terminal, and the P-side and the N-side charge balanced type class D amplifiers to which the differential signals are output. Each charge balanced type class D amplifier comprises a PWM waveform generation circuit which is comprised of an integrating amplifier and a Schmitt trigger circuit, a level shift circuit for shifting the level of the PWM signals, an output buffer for amplifying the level-shifted signals, and a feedback circuit for feeding back the output of the output buffer negatively to the integrating amplifier. The feedback circuit is constructed such that the feedback amount is variable depending on HIGH or LOW of the output of the output buffer by selecting a predetermined resistance depending on HIGH or LOW.

11 Claims, 8 Drawing Sheets

CLASS D AMPLIFIER

BACKGROUND OF THE INVENTION

1. Field of the Invention

The present invention relates to a class D amplifier to be installed in a portable telephone, for example, and more particularly to the class D amplifier of which the power consumption is decreased.

2. Description of the Related Art

Generally a digital amplifier comprises a comparator receiving an audio signal and a triangular wave carrier wave, putting out a PWM (Pulse Width Modulation) signal, and a class D output stage which amplifies the output of the comparator.

In such a digital amplifier, the comparator compares the audio signal and the triangular wave, and generates the PWM signal. The output stage switch is controlled by this PWM signal, and the load unit, such as a speaker, is driven by the output of the class D output stage. The high frequency component is removed by the output LPF (Low Pass Filter) during driving the load unit.

Practically, however, in the digital amplifier, non-linear distortion is generated due to the curvature of the triangular wave, pulse width distortion and power supply voltage variations, so negative feedback is used to improve non-linear distortion. One of such methods negatively feeds back the output of the output stage to the integrating amplifier installed as an integrating circuit in a previous stage of the comparator. The integrating amplifier extracts and amplifies the low frequency component included in the feedback signal of the square wave (PWM wave).

While this separately-excited oscillation type PWM system operates with such incoming triangular waves, there is a self-excited oscillation type PWM digital amplifier which oscillates by itself without incoming external triangular waves so that the output of the integrating amplifier is a triangular wave (e.g. Japanese Unexamined Patent Application Publication No. 2003-115730 (hereafter referred to as "related art")). In the self-excited oscillation type PWM system, the triangular wave oscillation circuit is unnecessary, and a Schmitt trigger circuit, for example, is used instead of a comparator.

FIG. 5 is a block diagram depicting a conventional self-excited oscillation type class D amplifier. As FIG. 5 shows, the class D amplifier 101 with a differential output (Bridge—Tied Load: BTL) is comprised of a differential signal output unit 102 consisting of the resistors R101-R104 for converting voice signals from the input terminal Sin into differential signals, and the full differential amplifier A101, and each charge balanced class D amplifier at the P-side and N-side receiving the differential signals.

The N-side charge balanced class D amplifier comprises a PWM waveform generation circuit and a feedback circuit. The PWM waveform generation circuit consists of an integrating amplifier 103N consisting of an operation amplifier A102 and a capacitor C101, and a Schmitt trigger circuit 104N consisting of resistors R107-R109 and a comparator COMP 101. The feedback circuit comprises an output buffer B101 and a resistor R111 for negatively feeding back the output of the output buffer B101 to the integrating amplifier 103N. The PWM waveform generation circuit consisting of the integrating amplifier 103N and the Schmitt trigger circuit 104N, is a self-excited oscillation type oscillation circuit which oscillates automatically without providing triangular waves, and the output of the integrating amplifier 103N is a triangular wave.

The Schmitt trigger circuit 104N, at the power supply level is VDD1, has the following two threshold values according to the output LOW or HIGH for determining LOW and HIGH of the input voltage (output of integrating amplifier 103N).

$V_H = V\text{com}((R107+R109)/R109)$ $V_L = (V\text{com}(R107+R109) - VDD1 \times R107)/R109$ The P-side charge balanced class D amplifier is also configured similar to the N-side, and in the Schmitt trigger circuit 104P, has the following two threshold values according to the output LOW or HIGH for determining LOW and HIGH of the input voltage (output of the integrating amplifier 103P).

$V_H = V\text{com}((R108+R110)/R110)$ $V_L = (V\text{com}(R108+R110) - VDD1 \times R108)/R110$ Now the operation of the conventional class D amplifier will be described. FIG. 6 is a diagram depicting the signal waveform of each node in the class D amplifier 101, where S1 is a voice signal (analog signal) which comes from the input terminal Sin, S2 is an output waveform of the output buffer B102 when the voice signal is a silent signal, S3 is the P-side output waveform when the voice signal of S1 is presented from Sin, S4 is the N-side output waveform when the voice signal of S1 is provided from the input terminal Sin, and S5 is an amplitude applied to the load to be connected to the subsequent stage of the class D amplifier. FIG. 7 shows the relationship of the output voltage of the integrating amplifier (input voltage of the comparator) and the output voltage (Vout) of the output terminal OUTP where the abscissa is time and the ordinate is voltage.

First the case when voice signals are not provided from the input terminal Sin (voice signal=silent signal) will be described. The non-inverting input terminals of the integrating amplifiers 103N and 103P are connected to the reference potential Vcom respectively, and the non-inverting input terminals of the comparators COMP 101 and 102 are connected to the reference potential Vcom respectively. Each charge balanced class D amplifier at the P-side and the N-side operates similarly, so the operation of only the P-side charge balanced class D amplifier will be described below.

In the case when the voice signal is the silent signal, the voltage Vsin of the non-inverting input terminal of the integrating amplifier 103P is Vsin=Vcom. As FIG. 7A shows, if the output voltage Vout of the output terminal OUTP is HIGH (power supply level) (time T1), the output voltage $V_A$ of the integrating amplifier 103P drops since the current flows into the capacitor C102 of the integrating amplifier 103P through the resistor R112. If the output $V_A$ of the integrating amplifier 103P goes below the threshold level $V_L$ of the comparator COMP 102, the output voltage Vout of the output terminal OUTP goes LOW, and current flows out of the integrating amplifier 103P, so the output voltage $V_A$ of the integrating amplifier 103P increases. If the output voltage $V_A$ of the integrating amplifier 103P exceeds the threshold level $V_H$ of the comparator COMP 102, the comparator COMP 102 puts out HIGH, and the output terminal OUTP goes HIGH. Repeating the operations results in oscillation. At this time, the charge amount that flows into the integrating amplifier 103P from the output terminal OUTP via the feedback circuit and the charge amount which flows out from the integrating amplifier 103P to the OUTP side are equal, so the average output level is equal to the non-inverting input level (Vcom) of the integrating amplifier 103P (S2 in FIG. 6).

Now the case when the voice signal is input from the input terminal Sin will be described. According to the voice signal amplitude from the input terminal Sin shown in FIG. 5, the output level (Aop) of the differential amplifier A101 becomes as follows.

Aop=(Vsin−Vcom)×R104/(2×R101)

When the level of Aop is higher than the non-inverting level Vcom of the integrating amplifier A103, current flows into the integrating amplifier A103 from Aop. If the output terminal OUTP is HIGH at this time, the current that flows into the integrating amplifier 103P is the sum of the current from Aop and the current from the feedback circuit, thus as time T1 in FIG. 7B shows, the output voltage reaches the threshold level $V_L$ of the comparator COMP 102 and the output terminal OUTP goes LOW sooner compared with the case of the silent signal, that is time T1 in FIG. 7A. This means that the width of HIGH has become shorter. If the output terminal OUTP is LOW, on the other hand, the current that flows into the integrating amplifier 103P is the current from the feedback circuit from which the current from Aop is subtracted, therefore compared with the case of the silent signal, the time to reach the threshold level $L_H$ of the comparator COMP2 (time T2) becomes longer. This means that the time period of LOW becomes longer.

This is the same for the case when the level of Aop is at the lower level than Vcom, and as FIG. 7C shows, when the output terminal OUTP is HIGH, time T1 is longer since the current that flows into the integrating amplifier 103P is subtracted, and when the output terminal OUTP is LOW, the time T2 is shorter since the current that flows into the integrating amplifier A103 is added. In this way, PWM waveforms, where the duty of the output pulse changes according to the level of Aop, can be generated as shown in S3 and S4 in FIG. 6.

The output waveform which is acquired by filtering this output is as follows.

Vout=(Vsin−Vcom)×R104×R112/(2×R101×R106)+Vcom

In other words, the loop from the integrating amplifier 103P at the P-side to the output buffer B102 has inversing amplifiers connected in a series. This is the same for the loop from the integrating amplifier 103N at the N-side to the output buffer B101.

However in the class D amplifier 101 shown in FIG. 5, the power supply voltage of the switching circuit in the output buffers B101 and B102 may fluctuate, and if this power supply voltage fluctuates, the gain fluctuates, therefore in some cases the system becomes unstable. To avoid this, the above mentioned the related art discloses a power amplifier (hereafter class D amplifier), where voltages, after the positive power supply voltage and negative power supply voltage of the switching circuit of the output stage are divided at a predetermined voltage dividing ratio, are switched according to the output of the comparator, and are input to the input end of the comparator.

FIG. 8 is a diagram depicting a major section of the class D amplifier described in the related art. As FIG. 8 shows, the conventional class D amplifier comprises a PWM modulation circuit 133a and a switching circuit 134 for amplifying the PWM signals which are output from the PWM modulation circuit 133a, wherein the PWM signals amplified by the switching circuit 134 are output to the speaker (not illustrated) via the LC filter (not illustrated). The switching circuit 134 comprises an N-type FET (Field Effect Transistor) 145 and a P-type FET 146, which are connected in series.

The PWM modulation circuit 133a comprises an integrating amplifier 139 consisting of a capacitor 136 and an operational amplifier 137, a comparator 140, a resistor 142 disposed between the output of the integrating amplifier 139 and non-inverting input terminal of the comparator 140, and an inverter 186 for inverting the output of the comparator 140. The PWM modulation circuit 133a further comprises a switch 182 for the positive side power supply voltage VPX to be connected to the common terminal via the resistor 181, and the switch 182 switches the two contacts so that the GND or the node P between the non-inverting input terminal of the comparator 140 and the resistor 142 is selected according to the output of the comparator 140. The PWM modulation circuit 133a also comprises a switch 184 for the negative side power supply voltage VMX to be connected to the common terminal via the resistor 183, so that the common terminal switches the two contacts so that the GND or the node P is selected according to the inverting output of the comparator 140.

The switch 182 controls such that the common terminal and the node P are connected when the output of the comparator 140 is HIGH level, and the common terminal and the GND are connected when the output is LOW level. The switch 184 controls such that the common terminal and the node P are connected when the output of the comparator 140 is LOW level, and the common terminal and the GND are connected when the output is HIGH level.

In the conventional class D amplifier configured in this way, the maximum value VP and the minimum value VM of the integrating output (triangular wave), which is input to the input end P of the comparator 140, are in proportion to the power supply voltages VPX and VMX of the switching circuit 134 respectively. As a result, the gain from the node P at the input end side of the comparator 140 to the output end Q of the switching circuit 134 is a constant, as shown in the following Expression (1), which is no relation to the power supply voltage VPX and VMX, therefore the fluctuation of the circuit gain based on the power supply voltages VPX and VMX can be prevented.

$$G=(VPX-VMX)/(VP-VM) \qquad (1)$$

However as described above, the charge balanced type class D amplifier shown in FIG. 5 has resistance feedback, assuming that the PWM conversion unit comprised of the full differential amplifier 102, integrating amplifiers 103N and 103P and Schmitt trigger circuits 104N and 104P, and the output unit (output buffers B101, B102) are constructed under the same level of the power supply. For a circuit for which low power consumption is demanded, such as a circuit for a portable telephone, only the power supply level for the output buffers B101 and B102 may be increased, while decreasing the power supply level for the other signal conversion sections, so that power consumption is decreased and high amplitude is acquired. In this case, if the configuration based on resistance feedback is used, the average level of output at the silent signal is determined by the non-inverting input level of the integrating amplifiers 103N and 103P, so the GND side clamps and amplitude cannot be sufficient.

Also in the class D amplifier shown in FIG. 8, the gain of the input signal and output signal can be determined by the ratio of the resistance 132 and the resistance 187, but the output at silent signal becomes the same as the non-inverting input level of the integrating amplifier 139, so if the power supply level of the PWM modulation circuit 133a is VDD1 and the power supply level of the switching circuit 134 is VDD2, then the output of the switching circuit 134 cannot be amplified fully to the power supply level with VDD2/2 at the center, and a sufficiently high amplitude cannot be acquired.

SUMMARY OF THE INVENTION

According to one aspect of the present invention, there is provided a class D amplifier which includes a pulse width modulation circuit for outputting pulse width modulation signal according to input signal, a level shift circuit for shifting a level of output of the pulse width modulation circuit, and a feedback circuit which is connected to an output side of the level shift circuit, for feeding back a feedback signal to the pulse width modulation circuit, wherein the feedback circuit converts a feedback amount according to an output level from the level shift circuit into a feedback amount according to the pulse width modulation circuit, and outputs the converted feedback amount as the feedback signal.

According to the present invention, even in the case when the output of the pulse width modulation circuit with a low power supply level is shifted and output to decrease power consumption, for example, the feedback signal to feedback the output of the level shift circuit can be converted into the feedback amount according to the power supply level of the pulse width modulation circuit by the feedback circuit for feedback, and the power supply level of the PWM conversion circuit and that of the output stage in a subsequent stage can be independently set.

And the feedback amount according to the output after level shift in a subsequent stage of the pulse width modulation circuit is converted into the feedback amount according to the pulse width modulation circuit for feedback, so even after PWM conversion, level shift is possible in a previous stage of the output stage, so power consumption can be decreased. Also feedback is performed for the output after level shift, so the influence by power supply noise can be cancelled.

According to another aspect of the present invention, there is provided a class D amplifier which includes a full differential amplifier for converting an input signal into differential signals and outputting them, a first pulse width modulation circuit for outputting a pulse width modulation signal according to the differential signal from one side of the full differential amplifier, a first level shift circuit for shifting a level of an output of the first pulse width modulation circuit, a first feedback circuit which is connected to an output side of the first level shift circuit, for feeding back a first feedback signal to the first pulse width modulation circuit, a second pulse width modulation circuit for outputting a pulse width modulation signal according to the differential signal from the other side of the full differential amplifier, a second level shift circuit for shifting a level of an output of the second pulse width modulation circuit; and a second feedback circuit which is connected to an output side of the second level shift circuit, for feeding back a second feedback signal to the second pulse width modulation circuit, wherein the first and second feedback circuits convert a feedback amount according to an output level from the first and second level shift circuits into a feedback amount according to the first and second pulse width modulation circuits respectively, and outputs the converted feedback amounts as the first and second feedback signals respectively.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

An embodiment of the present invention will now be described with reference to the drawings. This embodiment is the present invention applied to a class D amplifier which is suitable for equipment which demands low power consumption, such as a flat panel speaker for a liquid crystal panel of a portable telephone, for example.

Figure 1:
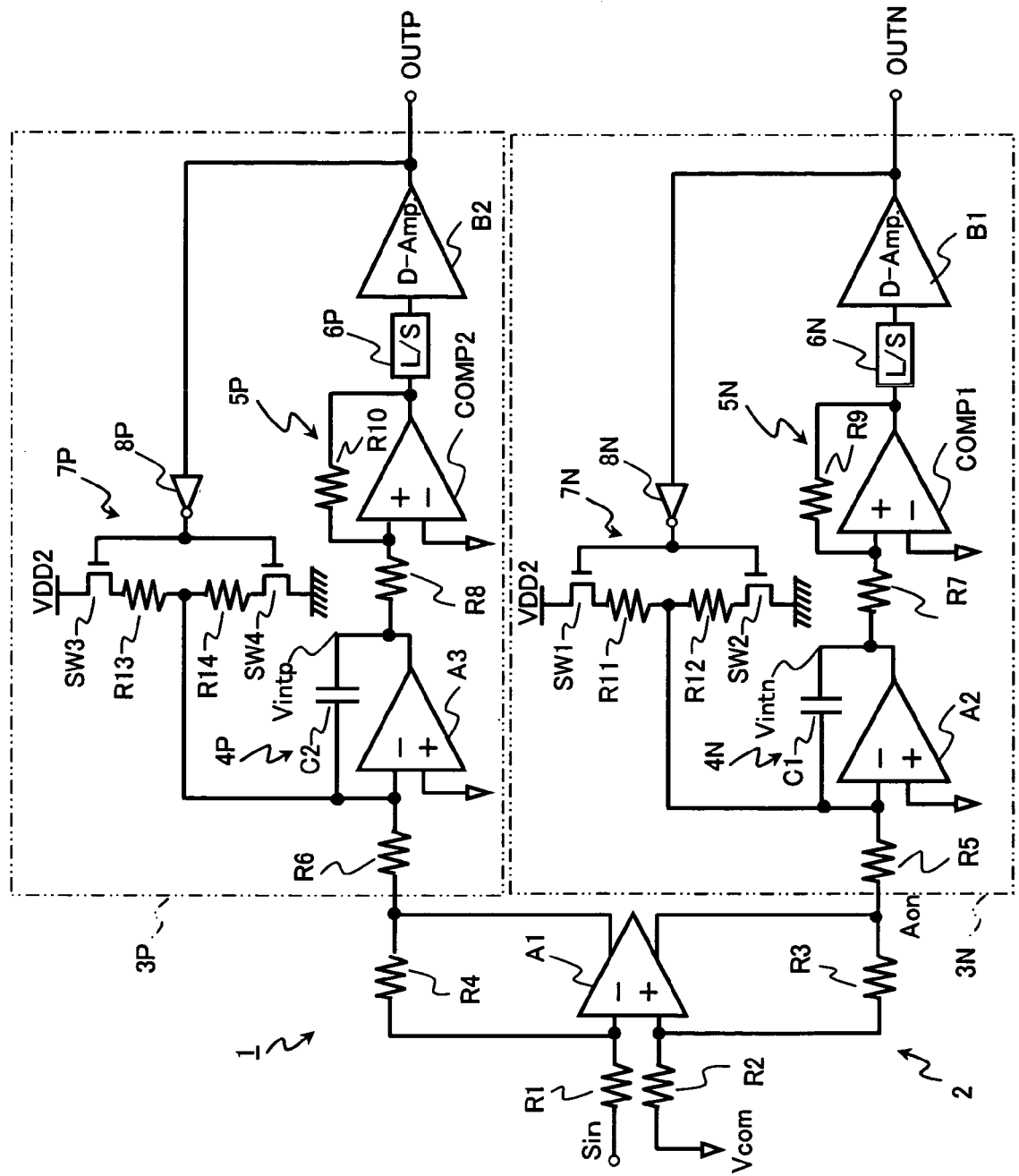
FIG. 1 is a block diagram depicting the class D amplifier according to an embodiment of the present invention.

FIG. 1 is a block diagram depicting the class D amplifier according to the present embodiment. As FIG. 1 shows, the class D amplifier 1 according to the present embodiment comprises a differential signal output unit 2, which is comprised of resistors R1-R4 and a full differential amplifier A1, and P-side and N-side charge balanced type class D amplifiers 3N and 3P to which the differential signals are output. The differential signal output unit 2 converts the voice signal from the input terminal Sin into differential signals.

The N-side charge balanced type class D amplifier 3N comprises: a PWM waveform generation circuit, which is comprised of an integrating amplifier 4N which consists of an operational amplifier A2 and a capacitor C1, and a Schmitt trigger circuit 5N which consists of resistors R7 and R9, and a comparator COMP1; a level shift (L/S) circuit 6N for level-shifting the output of the Schmitt trigger circuit 5N; an output buffer B1 for amplifying the output of the level shift circuit 6N; and a charge balanced type feedback loop (feedback circuit) 7N for negatively feeding back the output of the output buffer B1 to the integrating amplifier 4N. In the present embodiment, it is assumed that the power supply level of the PWM waveform generation circuit is VDD1, and the power supply level after level shift is VDD2.

The P-side charge balanced type class D amplifier 3P is also constructed in the same way as the N-side charge balanced type class D amplifier 3N, and comprises: a PWM waveform generation circuit which is comprised of an integrating amplifier 4P which consists of an operational amplifier A3 and a capacitor C2, and a Schmitt trigger circuit 5P which consists of resistors R8 and R10 and a comparator COMP2; a level shift (L/S) circuit 6P for level-shifting the output of the Schmitt trigger circuit 5P; an output buffer B2 for amplifying the output of the level shift circuit 6N; and a charge balanced type feedback loop 7P for negatively feeding back the output of the output buffer B2 to the integrating amplifier 4P.

In the case of the N-side charge balanced type class D amplifier 3N, in the integrating amplifier 4N, one of the differential signals and a feedback signal from the feedback circuit 7N are input to the inverting input terminal of the operational amplifier A2, by which electric charges are stored in the capacitor C1, and the output thereof becomes triangular waves. The non-inverting input terminal of the full differential amplifier A1 is connected to a fixed potential, such as Vcom, for example.

In the Schmitt trigger circuit 5N, the output of the integrating amplifier 4N is input to the non-inverting input terminal via the resistor R7 and the inverting input terminal is connected to a fixed potential, such as Vcom, for example. In this Schmitt trigger circuit 5N has the following two threshold values according to the output LOW level or HIGH level voltage for determining LOW level and HIGH level of the input voltage (output of the integrating amplifier 4N).

$$V_H = V\text{com}((R7+R9)/R9)$$

$$V_L = (V\text{com}(R7+R9) - VDD1 \times R7)/R9$$

The P-side charge balanced type class D amplifier is constructed similar to the N-side, and the Schmitt trigger circuit 5P has the following two threshold values.

$$V_H = V\text{com}((R8+R10)/R10)$$

$$V_L = (V\text{com}(R8+R10) - VDD1 \times R8)/R10$$

The PWM waveform generation circuit, which is comprised of the integrating amplifier 4N and the Schmitt trigger circuit 5N is a self-excited oscillation type oscillation circuit which automatically oscillates without inputting triangular waves, and makes the output of the integrating amplifier 4N to be triangular waves.

The level shift circuit 6N is for converting the output of the Schmitt trigger circuit 5N into the power supply level of the output buffer B1. As described above, if the class D amplifier is installed in equipment which is used for such an application as a portable telephone of which power consumption is limited, the smaller the power consumption the better, so low power consumption is implemented by constructing the PWM waveform generation circuit in the previous stage of the output buffer B1 such that the power supply level is decreased. For this, it is necessary to level-shift the output of the PWM waveform generation circuit by the level shift circuit 6N, and the power supply level is increased in the output stage so as to acquired high amplitude. In this case, the power supply level VDD1 of the operational amplifiers A2 and A3 constituting the integrating amplifiers 4N and 4P, and the comparators COMP1 and COMP2 constituting the Schmitt trigger circuits 5N and 5P, is 3V, for example, and the power supply level VDD2 of the output buffers B1 and B2 is 15V, for example.

However if resistance feedback is performed on level-shifted signals in a conventional way, the average output level at silent signal is determined by the non-inverting input level of the integrating amplifier, so the GND side clamps and sufficient amplitude cannot be taken. To take sufficient amplitude, the average output level at silent signal must be changed according to the power supply level VDD2 of the output buffers B1 and B2. In other words, the average output level at silent signal must be VDD2/2. Therefore in the present embodiment, these feedback circuits 7N and 7P are constructed such that the feedback amount is variable according to the output level of the output buffers B1 and B2, so that the output is oscillated with VDD2/2 at the center, by which amplitude can fully reach the power supply level.

In other words, in the N-side charge balanced type class D amplifier 3N, the feedback circuit 7N set the current feedback amount by adjusting R11 according to VDD2. so that the current feedback amount does not become high by VDD2. For this, the feedback circuit 7N comprises an inverter 8N for inverting the output of the output buffer B1, a switch SW1, which is comprised of an MOS (Metal Oxide Semiconductor) transistor, for example, which turns ON/OFF by the output of the inverter 8N, a resistor R11 which is connected to the power supply VDD2 via the switch SW1, a switch SW2 which turns ON/OFF by the output of the inverter 8N, and a resistor R12 of which one end is connected to the GND via the switch SW2 and the other end is connected to the resistor R11. And the node between the resistor R11 and the resistor R12 is connected with the integrating amplifier 4N, and the resistor R11 or R12 is selected as a feedback resistor according to the inverter output is LOW level or HIGH level.

In this feedback circuit 7N, the switch SW1 turns ON and the resistor R11 is connected to the power supply potential VDD2 when the output of the output buffer B1 is HIGH level, and the switch SW2 turns ON and the resistor R12 is connected to the GND when the output of the output buffer B1 is LOW level. The feedback circuit 7P at the P-side charge balanced type class D amplifier 3P is constructed similarly, wherein the switch SW3 turns ON and the resistor R13 is connected to the power supply potential VDD2 when the output of the output buffer B2 is HIGH level, and the switch SW4 turns ON and the resistor R14 is connected to the GND when the output of the output buffer B2 is LOW level.

In the feedback circuit 7N, the power supply potential VDD2 fixed potential Vcom and the resistance values of the resistors R11 and R12 (expressed as R11 and R12) have the relationship shown in the following Expression (2).

$$(VDD2-V\text{com})/R11 = (V\text{com}-(GND))/R12 \tag{2}$$

Also in the feedback circuit 7P, the power supply potential VDD2, fixed potential Vcom and the resistance values of resistors R13 and R14 (expressed as R13 and R14) have the relationship shown in the following Expression (3).

$$(VDD2-V\text{com})/R13 = (V\text{com}-(GND))/R14 \tag{3}$$

In other words, the feedback circuits 7N and 7P can switch the feedback amount by selecting the different resistance values R11 and R13 or R12 and R14 depending on the HIGH or LOW in the output buffers B1 and B2, so as to feedback the same level of current regardless the output level, and to enable the level shift of the PWM signal output.

Figure 2:
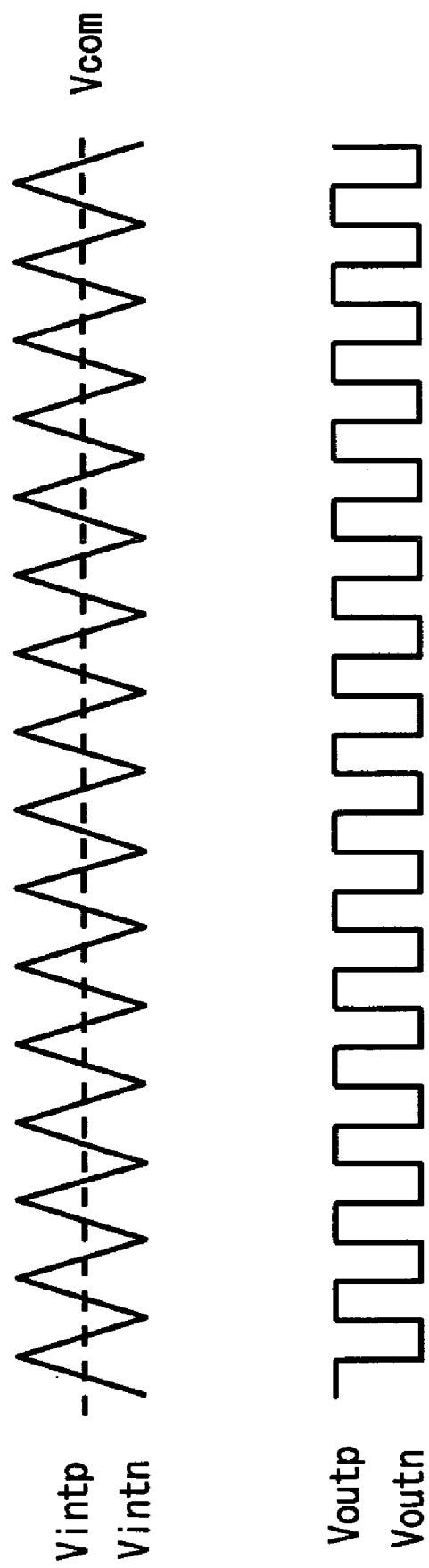
FIG. 2 is a diagram which indicate the output potentials Vintn and Vintp of the integrating amplifiers 4N and 4P when the input signal is a silent signal, and the output potentials Voutn and Voutp from the output OUTN and OUTP at this time.
Figure 3:
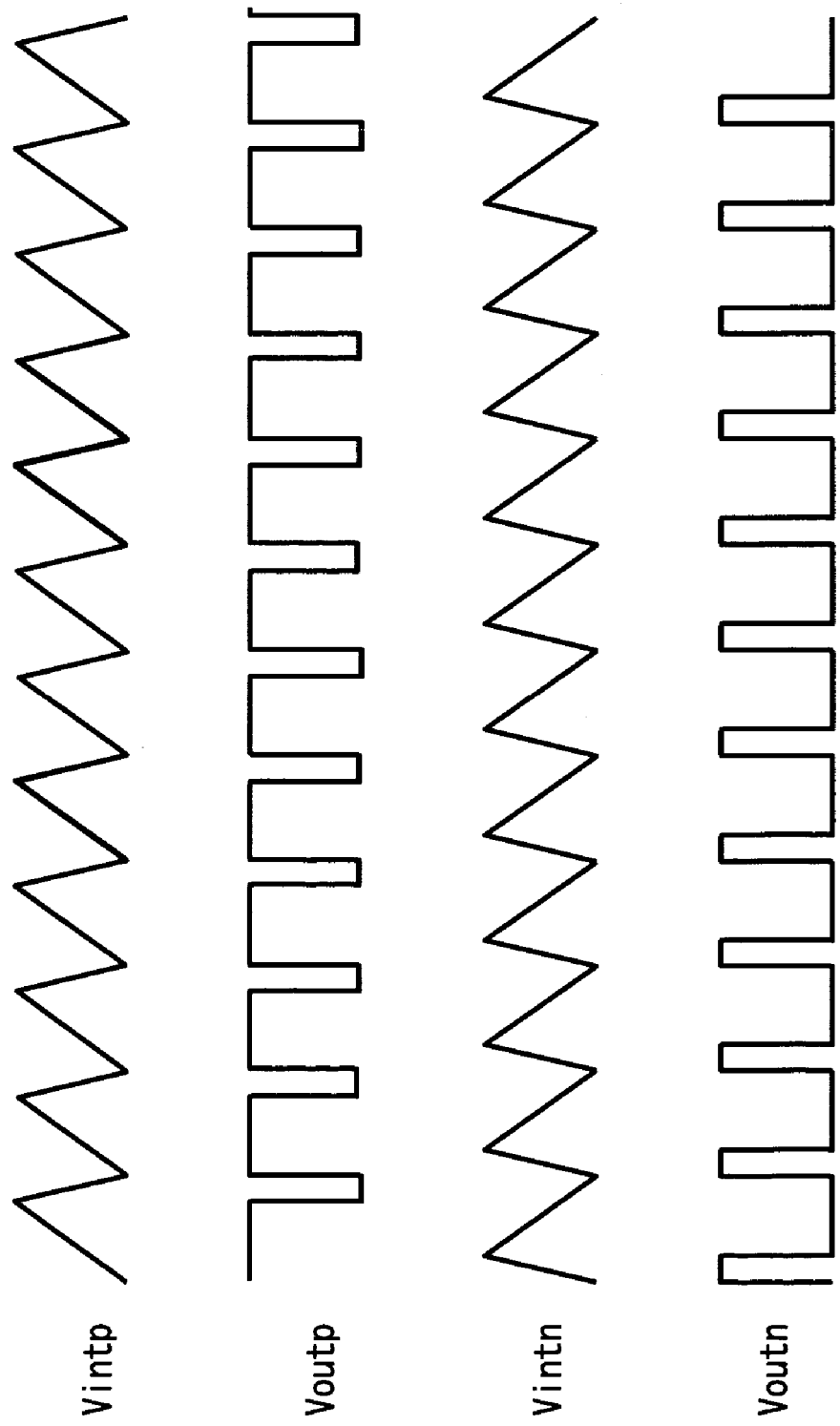
FIG. 3 is a diagram in each node or at the output in the case of the input voltage signal Vsin>Vcom.
Figure 4:
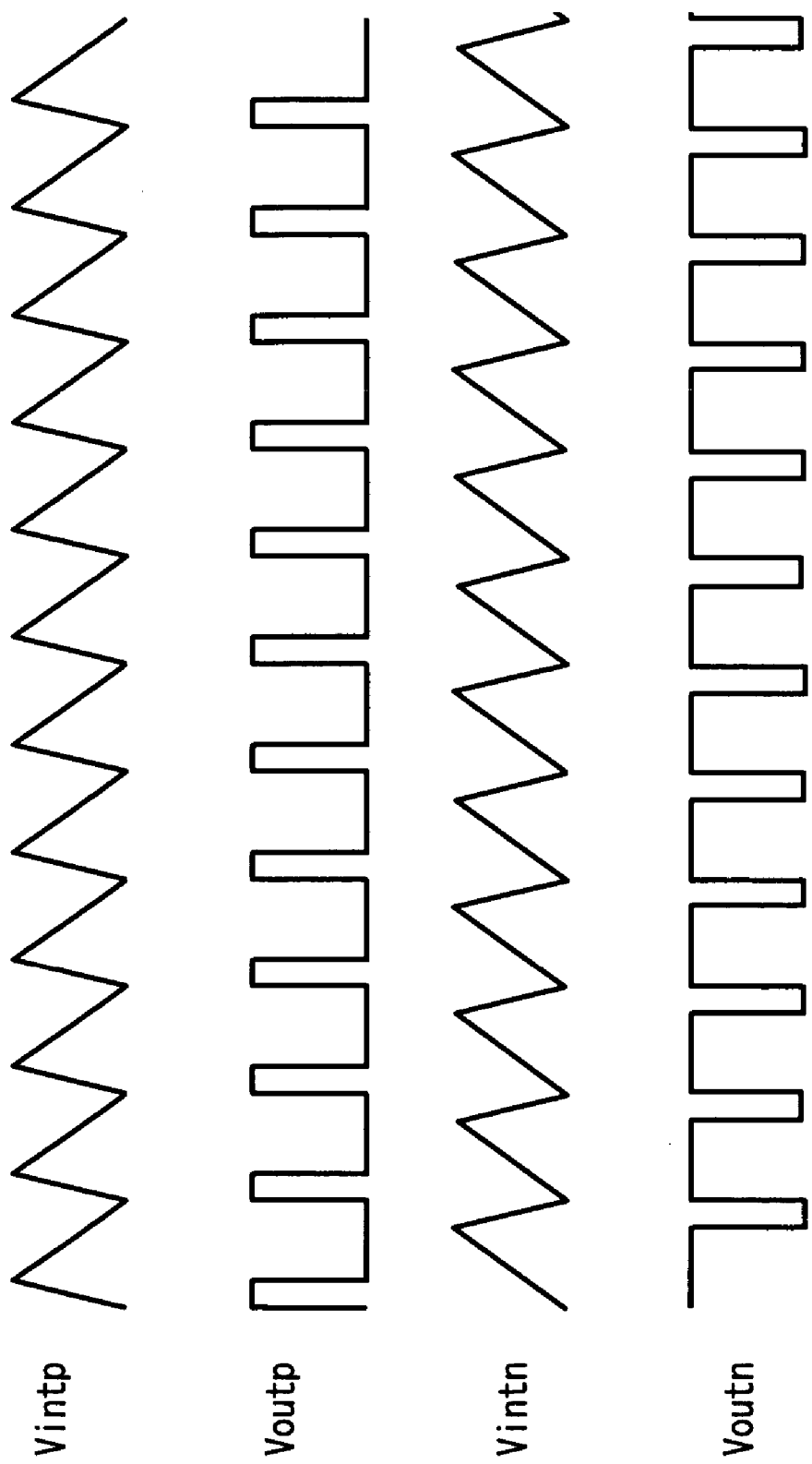
FIG. 4 is a diagram in each node or at the output in the case when the input voltage signal Vsin<Vcom.
Figure 5:
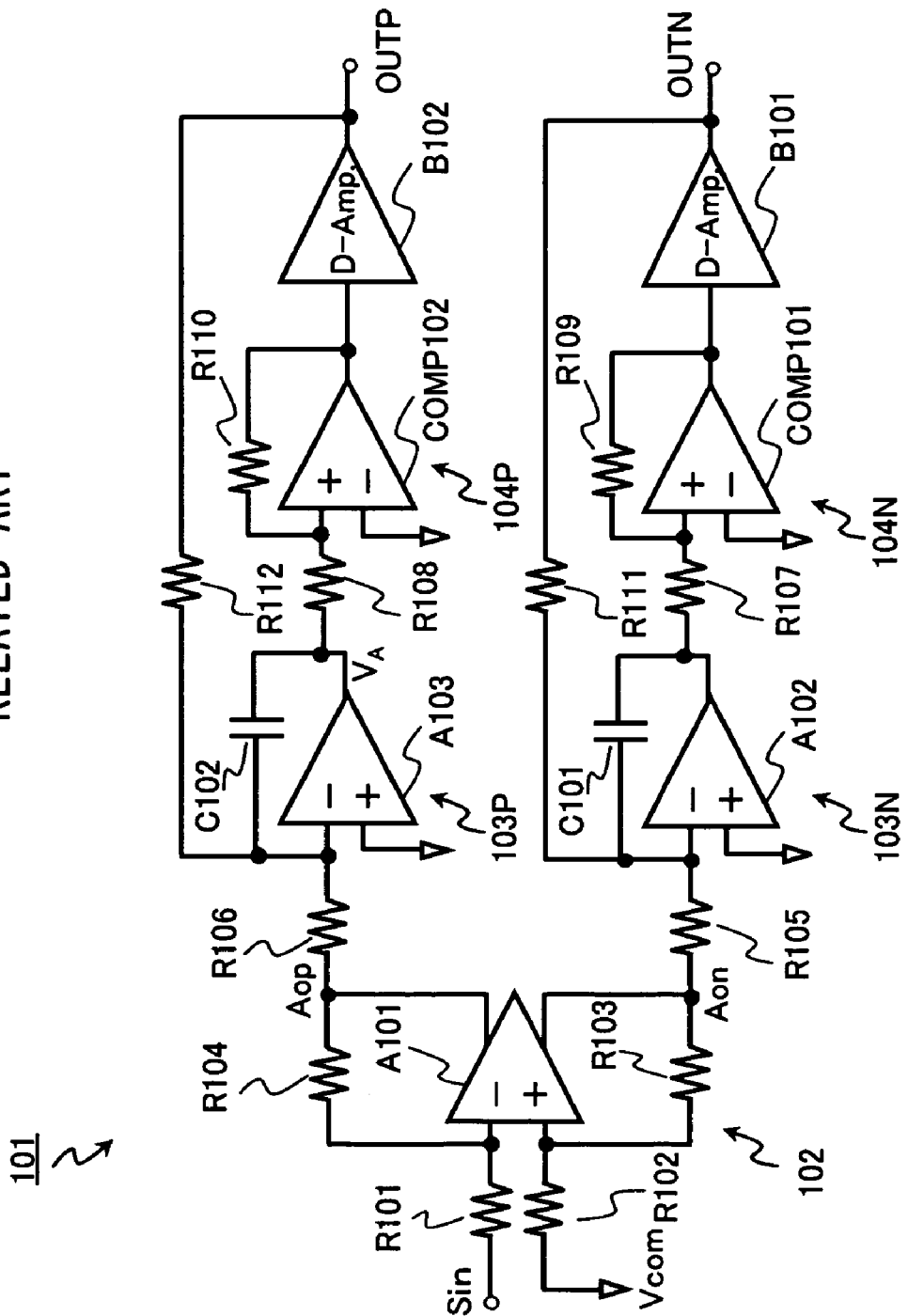
FIG. 5 is a block diagram depicting a conventional self-excited oscillation type class D amplifier.
Figure 6:
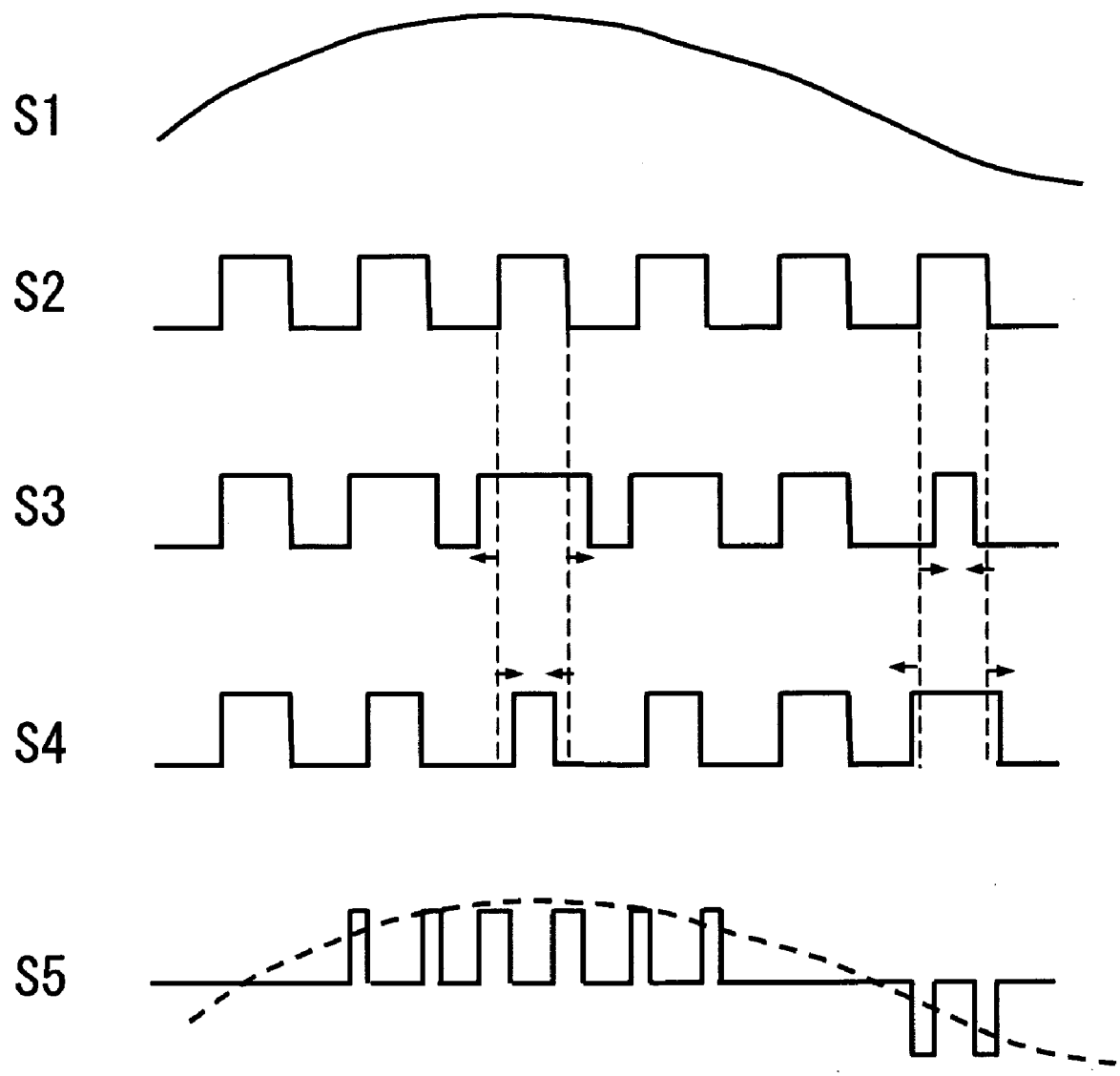
FIG. 6 is a diagram depicting the signal waveform at each node of the class D amplifier.
Figure 7A:
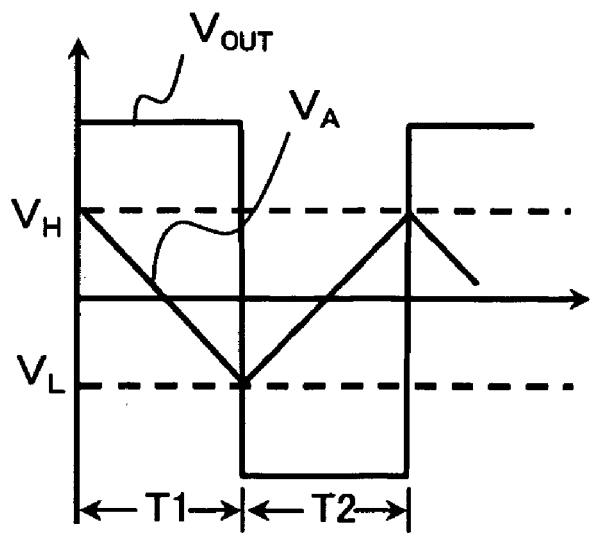
FIG. 7A-FIG. 7C show the relationship between the output voltage (input voltage of comparator) of the integrating amplifier and the output voltage of OUTP where the abscissa is time and the ordinate is voltage.
Figure 7B:
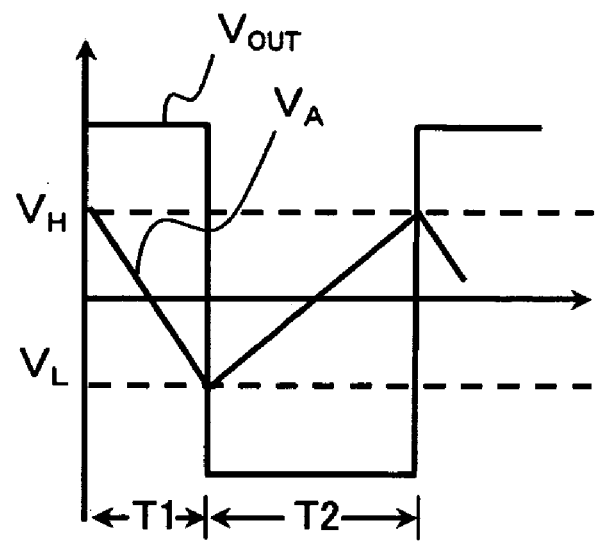
Figure 7C:
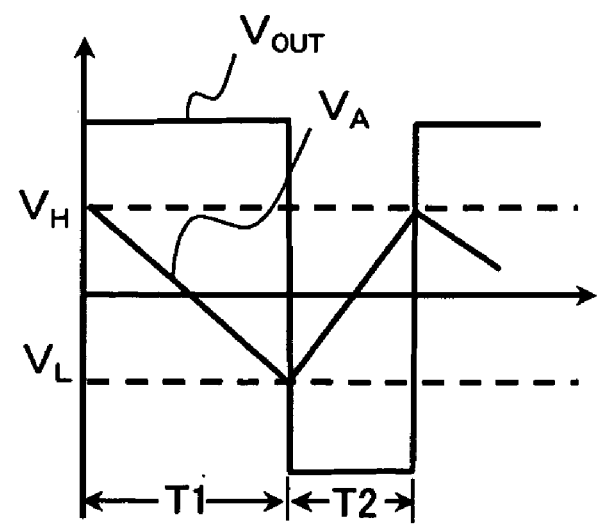
Figure 8:
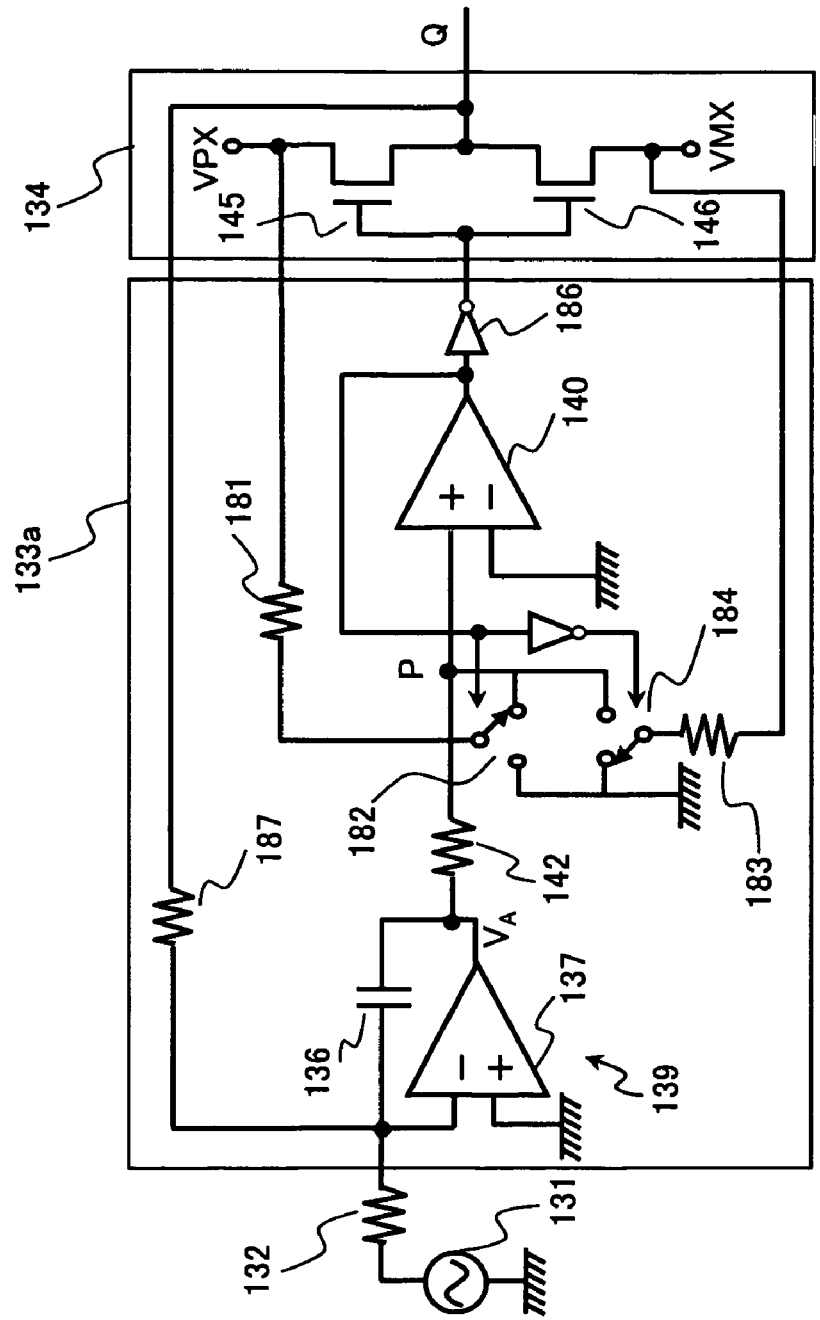
FIG. 8 is a diagram depicting a major section of the class D amplifier described in the related art.

Now the operation of the class D amplifier according to the present embodiment will be described. FIG. 2 shows waveform diagrams which indicate the output potentials Vintn and Vintp of the integrating amplifiers 4N and 4P when the input signal is a silent signal, and the output potentials Voutn and Voutp from the output OUTN and OUTP at this time. FIG. 3 shows the output waveforms in each node or at the output in the case of the input voltage signal Vsin>Vcom, and FIG. 4 shows the output waveforms in each node or at the output in the case when the input voltage signal Vsin<Vcom. In other words, FIG. 4 shows the output waveforms at output potential Vintp of the integrating amplifier 4P, the output potential Voutp of the output OUTP, the output potential Vintn of the integrating amplifier 4N, and the output potential Voutn of the output OUTN.

When the Vsin input is equal to Vcom, the input from the differential signal output unit 2 is 0, therefore the currents which flow into Vintn and Vintp become (VDD2−Vcom)/R11

(VDD2−Vcom)/R13 respectively. And the currents which flow out of Vintn and Vintp become (Vcom−(GND))/R12

(Vcom−(GND))/R14 respectively.

Since these currents that flow in and currents that flow out are equal as the above Expressions (2) and (3) show (hereafter this current amount is expressed as Ifb), Vintn and Vintp present triangular waves of which the up and down inclinations are the same as shown in FIG. 2. These triangular waves becomes the square waves shown in FIG. 2 in the Schmitt trigger circuits 5N and 5P by the above mentioned two threshold values. If the input from the input terminal Sin is silent signal, Vintp=Vintn and Voutp=Voutn are established, and the output waveforms of the N-side charge balanced type class D amplifier 3N and the P-side charge balanced type class D amplifier 3P are the waveforms shown in FIG. 2.

Now the case when the signal is input to Vsin will be described. In the case of Vsin>Vcom, if the charge that flows into Vintp from the differential signal output unit 2 is Iin, then the current that flows into the capacitor C2 is Ifb+Iin when the output OUTP is at HIGH, where Iin<0, therefore the inclination of the voltage rise of Vintp becomes smaller than the case of the silent signal (Vintp in FIG. 3), resulting in the longer time period of HIGH level (Voutp in FIG. 3). When the output OUTP is at LOW, on the other hand, the current that flows into the capacitor C2 is −Ifb+Iin, the inclination of the voltage drop of Vintp increases, resulting in the decrease time period of LOW.

In the case of Vintn, the opposite of this occurs, in other words, when the output OUTN is at HIGH, the time period of HIGH becomes shorter in Vintn, and when the output OUTN is at LOW, the time period of LOW becomes longer, as Vintn and Voutn in FIG. 3 show.

In the case of Vsin<Vcom, when the output OUTP is at HIGH, the current that flows into the capacitor C2 is Ifb+Iin, where Iin>0, therefore the inclination of the voltage rise of Vintp becomes larger than the case of the silent signal (Vintp in FIG. 4), and the time period Of HIGH level becomes shorter (Voutn in FIG. 4). When the output OUTP is at LOW, on the other hand, the current that flows into the capacitor C2 is −Ifb+Iin, the inclination of the voltage drop of Vintp decreases, resulting in the longer time period of LOW.

As mentioned above, the opposite of this occurs in the case of Vintn, in other words, when the output OUTN is at HIGH, the time period of HIGH becomes longer in Vintn, and when the output OUTN is at LOW, the time period of LOW becomes shorter, as Vintn and Voutn in FIG. 4 shows.

In the present embodiment, the outputs of the Schmitt trigger circuits 5N and 5P are converted into the power supply levels of the output stage (output buffer B1 and B2) in the level shift circuits 6N and 6P, and are output from OUTN and OUTP, but the feedback charge amount at the power supply side and the GND side are changed respectively, and the average level of the output at silent signal can be equivalently changed by inserting the inverters 8N and 8P in the feedback paths from OUTN and OUTP respectively, alternately turning the switches SW1-SW4 ON and OFF at the power supply side and the GND side by the output of the inverters 8N and 8P, selecting the resistor R11 or R12, or the resistor R13 or R14, and feeding back the current according to the selected resistance to the integrating amplifiers 4N and 4P.

It is apparent that the present invention is not limited to the above embodiment, that may be modified and changed without departing from the scope and spirit of the invention. For example, in the above embodiment, it was described that the feedback circuits 7N and 7P are supposed to be comprised of two feedback resistors having predetermined resistance values, but the feedback resistors in the feedback circuits 7N and 7P may be comprised of variable resistors. In this case, a plurality of resistors having different resistance values are connected in parallel, and the resistors are connected by switching using the external control signals, for example, so that the resistance values are switched by the external control signal, and the desired resistance value is implemented.

In this case, as the following Expression (4) shows, the ratio of the average resistance values of the feedback circuits 7N and 7P and the resistance 5 or resistance 6 becomes the gain G of this system. In other words, the gain of the system can be variable by constructing the feedback circuits 7N and 7P such that the resistance values can be set variable.

Gain $G=2 \times R6/(R11+R12)$ (4)

What is claimed is:

1. A class D amplifier comprising:
   a pulse width modulation circuit for outputting a pulse width modulation signal according to an input signal;
   a level shift circuit for shifting a level of the output of the pulse width modulation circuit; and
   a feedback circuit which is connected to an output side of the level shift circuit, for feeding back a feedback signal to the pulse width modulation circuit,
   wherein the feedback circuit comprises a first switch and a second switch which turn ON when the output level from the level shift circuit is HIGH level or LOW level respectively, and a first feedback resistor and a second feedback resistor which are selected by the first switch and the second switch respectively, and
   wherein the feedback circuit converts an output level from the level shift circuit into a feedback current amount according to the pulse width modulation circuit, and outputs the feedback current amount as the feedback signal.

2. The class D amplifier according to claim 1, wherein the first feedback resistor and the second feedback resistor have resistance values which are adjusted such that a power supply level after the level shift is shifted to a power supply level of the pulse width modulation circuit, and feeds back the feedback signal so as to cancel noise by the power supply after the level shift.

3. The class D amplifier according to claim 2, wherein the power supply level after the level shift is greater than the power supply level of the pulse width modulation circuit.

4. The class D amplifier according to claim 1, wherein first and second feedback resistors are variable resistors, each of which can vary resistance values by an external control signal.

5. The class D amplifier according to claim 1, further comprising an output buffer for amplifying an output of the level shift circuit, wherein the feedback circuit feeds back an output of the output buffer to the pulse width modulation circuit.

6. The class D amplifier according to claim 5, wherein the feedback circuit adjusts the feedback current amount based on a level shift amount of the level shift circuit.

7. The class D amplifier according to claim 1, wherein the pulse width modulation circuit comprises an integrating circuit for integrating the input signal and the feedback signal, and a Schmitt trigger circuit for comparing an output of the integrating circuit and a reference potential, and outputting a pulse width modulation signal, wherein the feedback circuit inputs the feedback signal into the integrating circuit.

8. The class D amplifier according to claim 7, wherein the output of the integrating circuit is a triangular wave.

9. The class D amplifier according to claim 1, wherein the feedback circuit adjusts the feedback current amount based on a level shift amount of the level shift circuit.

10. The class D amplifier according to claim 1, wherein the pulse width modulation circuit is a self-excited oscillation type oscillation circuit.

11. A class D amplifier comprising:
- a full differential amplifier for converting an input signal into a first differential signal and a second differential signal and outputting said first and second differential signals;
- a first pulse width modulation circuit for outputting a first pulse width modulation signal according to the first differential signal from one side of the full differential amplifier;
- a first level shift circuit for shifting a level of an output of the first pulse width modulation circuit;
- a first feedback circuit which is connected to an output side of the first level shift circuit, for feeding back a first feedback signal to the first pulse width modulation circuit;
- a second pulse width modulation circuit for outputting a second pulse width modulation signal according to the second differential signal from the other side of the full differential amplifier;
- a second level shift circuit for shifting a level of an output of the second pulse width modulation circuit; and
- a second feedback circuit which is connected to an output side of the second level shift circuit, for feeding back a second feedback signal to the second pulse width modulation circuit,
- wherein the first feedback circuit comprises a first switch and a second switch which turn ON when the output level from the first level shift circuit is HIGH level or LOW level respectively, and a first feedback resistor and a second feedback resistor which are selected by the first switch and the second switch respectively,
- wherein the second feedback circuit comprises a third switch and a fourth switch which turn ON when the output level from the second level shift circuit is HIGH level or LOW level respectively, and a third feedback resistor and a fourth feedback resistor which are selected by the third switch and the fourth switch respectively, and
- wherein the first and second feedback circuits convert an output level from the first and second level shift circuits into a first and second feedback current amount according to the first and second pulse width modulation circuits respectively, and output the feedback current amounts as the first and second feedback signals respectively.

* * * * *